United States Patent
Otake et al.

(10) Patent No.: US 8,035,131 B2
(45) Date of Patent: Oct. 11, 2011

(54) METHOD FOR FORMING A NITRIDE SEMICONDUCTOR LAMINATED STRUCTURE AND METHOD FOR MANUFACTURING A NITRIDE SEMICONDUCTOR ELEMENT

(75) Inventors: Hirotaka Otake, Kyoto (JP); Hiroaki Ohta, Kyoto (JP); Shin Egami, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 27 days.

(21) Appl. No.: 12/531,059

(22) PCT Filed: Mar. 7, 2008

(86) PCT No.: PCT/JP2008/054179
§ 371 (c)(1),
(2), (4) Date: Sep. 11, 2009

(87) PCT Pub. No.: WO2008/111518
PCT Pub. Date: Sep. 18, 2008

(65) Prior Publication Data
US 2010/0047976 A1 Feb. 25, 2010

(30) Foreign Application Priority Data
Mar. 12, 2007 (JP) ................. 2007-061923

(51) Int. Cl.
*H01L 31/072* (2006.01)
*H01L 31/109* (2006.01)
*H01L 31/0328* (2006.01)
*H01L 31/0336* (2006.01)

(52) U.S. Cl. ........ 257/200; 257/201; 257/615; 257/656; 257/E21.051; 257/E21.085; 257/E21.217; 257/E21.227; 257/E21.311; 257/E21.319; 257/E21.539

(58) Field of Classification Search ............... 438/200, 438/201, 213, 288, 614, 615, 656; 257/E21.051, 257/217, 227, 311, 319, 539
See application file for complete search history.

(56) References Cited

U.S. PATENT DOCUMENTS
4,903,088 A * 2/1990 Van Opdorp .................... 257/76
(Continued)

FOREIGN PATENT DOCUMENTS
JP 10-144962 A 5/1998
(Continued)

OTHER PUBLICATIONS

Satoshi Okubo, "Not Only Shining Any Longer GaN Behind Evolution of Devices", Jun. 5, 2006, Nikkei Electronics, p. 51-60 with its partial English translation (3 pages).

*Primary Examiner* — David Nhu
(74) *Attorney, Agent, or Firm* — Rabin & Berdo, P.C.

(57) ABSTRACT

A method for forming a nitride semiconductor laminated structure includes forming a first layer that is an n-type or i-type first layer composed of a group III nitride semiconductor using an $H_2$ carrier gas; forming a second layer by laminating a p-type second layer composed of a group III nitride semiconductor and containing Mg on the first layer using an $H_2$ carrier gas; and forming a third layer that is an n-type or i-type third layer composed of a group III nitride semiconductor on the second layer using an $H_2$ carrier gas after forming the second layer. A method for manufacturing a nitride semiconductor device includes the method steps for forming the nitride semiconductor laminated structure.

3 Claims, 6 Drawing Sheets

U.S. PATENT DOCUMENTS

| | | |
|---|---|---|
| 5,780,876 A * | 7/1998 | Hata .............................. 257/103 |
| 6,020,602 A * | 2/2000 | Sugawara et al. ............. 257/103 |
| 6,221,684 B1 | 4/2001 | Sugawara et al. |
| 2001/0040246 A1 | 11/2001 | Ishii |
| 2003/0082860 A1 | 5/2003 | Yoshida et al. |
| 2006/0219997 A1 | 10/2006 | Kawasaki et al. |
| 2006/0220042 A1 | 10/2006 | Yaegashi et al. |
| 2009/0026556 A1* | 1/2009 | Otake et al. .................... 257/410 |
| 2010/0078688 A1* | 4/2010 | Otake et al. .................... 257/288 |

FOREIGN PATENT DOCUMENTS

| | | |
|---|---|---|
| JP | 2001-230410 A | 8/2001 |
| JP | 2003-163354 A | 6/2003 |
| JP | 2005-277358 A | 10/2005 |
| JP | 2006-286910 A | 10/2006 |
| JP | 2006-286954 A | 10/2006 |

* cited by examiner

METHOD FOR FORMING A NITRIDE SEMICONDUCTOR LAMINATED STRUCTURE AND METHOD FOR MANUFACTURING A NITRIDE SEMICONDUCTOR ELEMENT

TECHNICAL FIELD

The present invention relates to a method for forming a nitride semiconductor laminated structure employing group III nitride semiconductors, and a method for manufacturing a nitride semiconductor device employing group III nitride semiconductors.

PRIOR ART

In general, a power device employing a silicon semiconductor is employed for a power amplifier circuit, a power supply circuit, a motor driving circuit or the like.

However, improvement in withstand voltage, reduction in resistance and improvement in speed of a silicon device are now reaching limits due to the theoretical limit of the silicon semiconductor, and it is becoming difficult to satisfy requirements of the market.

Therefore, development of a GaN device having characteristics such as a high withstand voltage, a high-temperature operation, a high current density, high-speed switching and small on-resistance is examined (refer to Non-Patent Document 1, for example).

A hitherto proposed GaN device includes a sapphire substrate and a p-type GaN layer containing a p-type impurity (Mg, for example) laminated thereon, for example. Two n-type GaN regions containing an n-type impurity (Si, for example) are partially formed on the surface of the p-type GaN layer. A source electrode is formed to be ohmically connected to one of the n-type GaN regions, and a drain electrode is formed to be ohmically connected to the other n-type GaN region. A gate insulating film is formed on the surface of the p-type GaN layer, and a gate electrode is formed through the gate insulating film. Thus, the GaN device having a transverse structure in which a source, a gate and a drain are arrayed along the surface of the substrate is constituted.

In order to manufacture the aforementioned GaN device, the p-type GaN layer is first laminated on the sapphire substrate in an $H_2$ atmosphere by epitaxially growing a GaN-based semiconductor compound while supplying Mg. Then, the p-type GaN layer is doped with Si, and the pair of n-type GaN regions are formed around the surface of the p-type GaN layer. After the n-type GaN regions are formed, the gate insulating film is formed on the surface of the p-type GaN layer, the source electrode and the drain electrode bonded to the pair of n-type GaN regions respectively are formed, and the gate electrode is thereafter formed to be opposed to the p-type GaN layer through the gate insulating film.

Non-Patent Document 1: Satoshi Okubo, "Not Only Shining Any Longer GaN Behind Evolution of Devices", Jun. 5, 2006, Nikkei Electronics, p. 51-60

DISCLOSURE OF THE INVENTION

Problems to be Solved

In the aforementioned manufacturing method, however, $H_2$ may be mixed into the p-type GaN layer when the p-type GaN layer is laminated, to be bonded to Mg in the p-type GaN layer. When an H—Mg bond is formed, Mg in the p-type GaN layer is inactivated and does not function as an acceptor, and the resistance of the p-type GaN layer may be increased.

Therefore, such a GaN device is not necessarily suitable for a power device requiring a high current, and there is such a problem that implementation of a normally-off operation which can be regarded as indispensable for a power device is not necessarily easy.

Accordingly, a main object of the present invention is to provide a method for forming a nitride semiconductor laminated structure suitable for application to a power device or the like, employing group III nitride semiconductors.

Another object of the present invention is to provide a method for manufacturing a nitride semiconductor device having a nitride semiconductor laminated structure suitable for application to a power device or the like, employing group III nitride semiconductors.

Solutions to the Problems

The method for forming a nitride semiconductor laminated structure according to the present invention includes: a first layer forming step of forming an n-type or i-type first layer composed of a group III nitride semiconductor; a second layer forming step of laminating a p-type second layer composed of a group III nitride semiconductor and containing Mg on the first layer; and a third layer forming step of forming an n-type or i-type third layer composed of a group III nitride semiconductor on the second layer after the second layer forming step.

According to the method, the n-type or i-type first layer is formed, and the p-type second layer containing Mg is formed on the first layer. After the second layer is formed, the n-type or i-type third layer is formed on the second layer while no activation annealing treatment is performed on the second layer. Thus, the nitride semiconductor laminated structure is so formed as to hold the p-type second layer between the n-type or i-type first and third layers, whereby Mg in the second layer of the laminated structure can be kept in an active state to function as an acceptor. Consequently, the resistance of the second layer can be reduced, whereby the nitride semiconductor laminated structure can be suitably employed as a semiconductor structure of a power device requiring a high current. Further, no activation annealing treatment is required, whereby mass productivity is improved.

The "activation annealing treatment" denotes treatment of activating Mg (making Mg function as an acceptor) by annealing the second layer in an atmosphere (in an inert gas atmosphere, for example) in which $H_2$ is generally nonpresent at a prescribed temperature (not less than 400° C., for example) after the second layer is formed thereby removing $H_2$ mixed into the second layer.

In the method for forming a nitride semiconductor laminated structure, the third layer forming step preferably includes a step of forming the third layer in an $H_2$ atmosphere.

The method for manufacturing a nitride semiconductor device according to the present invention includes: a first layer forming step of forming an n-type or i-type first layer composed of a group III nitride semiconductor; a second layer forming step of laminating a p-type second layer composed of a group III nitride semiconductor and containing Mg on the first layer; a third layer forming step of forming an n-type or i-type third layer composed of a group III nitride semiconductor on the second layer after the second layer forming step; a wall surface forming step of forming a wall surface extending over the first, second and third layers; a gate insulating film forming step of forming a gate insulating film on the wall surface to extend over the first, second and third layers; a gate electrode forming step of forming a gate electrode to be opposed to the wall surface on the second layer through the gate insulating film; a drain electrode forming step of forming a drain electrode to be electrically connected to the first layer; and a source electrode forming step of forming a source electrode to be electrically connected to the third layer.

According to the method, the n-type or i-type first layer is formed, and the p-type second layer containing Mg is formed on the first layer. After the second layer is formed, the n-type or i-type third layer is formed on the second layer while no activation annealing treatment is performed on the second layer, whereby a nitride semiconductor laminated structure portion of an npn structure having the first, second and third layers is formed. Thereafter the wall surface extending over the first, second and third layers are formed. The gate insulating film is formed on the wall surface, to extend over the first, second and third layers. Further, the gate electrode is formed to be opposed to the wall surface on the second layer through the gate insulating film, the drain electrode is formed to be electrically connected to the first layer, and the source electrode is formed to be electrically connected to the third layer. When the first layer and the drain electrode as well as the third layer and the source electrode are electrically connected with one another at this time, another semiconductor layer may be further held between each layer and each electrode. Thus, a vertical MIS (Metal Insulator Semiconductor) field-effect transistor (the transistor is hereinafter simply abbreviated as "MISFET") can be obtained.

Thus, a normally-off operation, i.e., an operation for setting an OFF-state between the source and the drain when applying no bias to the gate electrode can be easily implemented due to the basic structure as the vertical MISFET. Further, a high current can be easily fed, and high withstand voltage characteristics can also be easily ensured by increasing the thickness of the first layer. Therefore, an effective power device can be provided. Needless to say, the MISFET is constituted of the group III nitride semiconductors, whereby the same can attain characteristics such as a high withstand voltage, a high-temperature operation, a high current density, high-speed switching and small on-resistance as compared with a device employing a silicon semiconductor. In particular, the MISFET is capable of an operation with a high withstand voltage and low loss, whereby an excellent power device can be implemented.

The group III-V nitride semiconductors are semiconductors prepared by combining group III elements and nitrogen with one another, and aluminum nitride (AlN), gallium nitride (GaN) and indium nitride (InN) are typical examples. The same can be generally expressed as $Al_xIn_yGa_{1-x-y}N$ ($0 \leq x \leq 1$, $0 \leq y \leq 1$ and $0 \leq x+y \leq 1$).

An operation of the MISFET is now described. First, a bias positive on the drain side is supplied between the source and the drain. At this time, it follows that a reverse voltage is applied to the p-n junction portion on the interface between the first and second layers, and hence the source and the drain are cut off. When applying a bias voltage of not less than a prescribed voltage value (a gate threshold voltage) positive with respect to the second layer to the gate electrode from this state, electrons are induced in a region (a channel region) around the surface of the second layer opposed to the gate electrode, and an inversion layer (a channel) is formed. The first and third layers conduct through the inversion layer, and it follows that the source and the drain conduct. Thus, the source and the drain conduct when a proper bias is supplied to the gate electrode, while the source and the drain are cut off when no bias is applied to the gate electrode. In other words, the normally-off operation is implemented.

In the method for manufacturing a nitride semiconductor device, the third layer forming step preferably includes a step of forming the third layer in an $H_2$ atmosphere.

The method for manufacturing a nitride semiconductor device preferably further includes a fourth layer forming step of forming a fourth layer different in conductivity from the second layer on a semiconductor surface portion of the second layer exposed due to the formation of the wall surface in the wall surface forming step.

The fourth layer which is a region different in conductivity from the second layer is formed on the semiconductor surface portion of the second layer exposed due to the formation of the wall surface in the wall surface forming step, whereby the gate insulating film is formed to be in contact with the fourth layer, and the gate electrode is formed to be opposed to the fourth layer through the gate insulating film.

Thus, the region where the inversion layer (the channel) is formed becomes the fourth layer in the aforementioned operation of the MISFET. Therefore, when the fourth layer is composed of a p-type semiconductor having an acceptor concentration lower than the acceptor concentration (the Mg concentration) of the second layer, for example, a gate voltage value necessary for forming the inversion layer can be suppressed lower as compared with a case where the conductivity of the region where the inversion layer is formed is identical to the conductivity of the second layer. The main factor deciding the voltage value of reach-through breakdown is the acceptor concentration of the overall second layer, and hence the gate threshold voltage can be reduced while ensuring high withstand voltage characteristics of the transistor as a result, and an excellent power device can be implemented.

The fourth layer may be composed of the aforementioned p-type semiconductor having an acceptor concentration lower than the acceptor concentration of the second layer, or may be composed of any one of an n-type semiconductor, an i-type semiconductor and a semiconductor containing an n-type impurity and a p-type impurity. When the fourth layer is composed of an n-type semiconductor, the concentration of an n-type impurity can be properly controlled in order to implement a normally-off operation of the field-effect transistor.

The foregoing and other objects, features and effects of the present invention will become more apparent from the following detailed description of the embodiments with reference to the attached drawings.

BEST MODE FOR CARRYING OUT THE INVENTION

Figure 1:
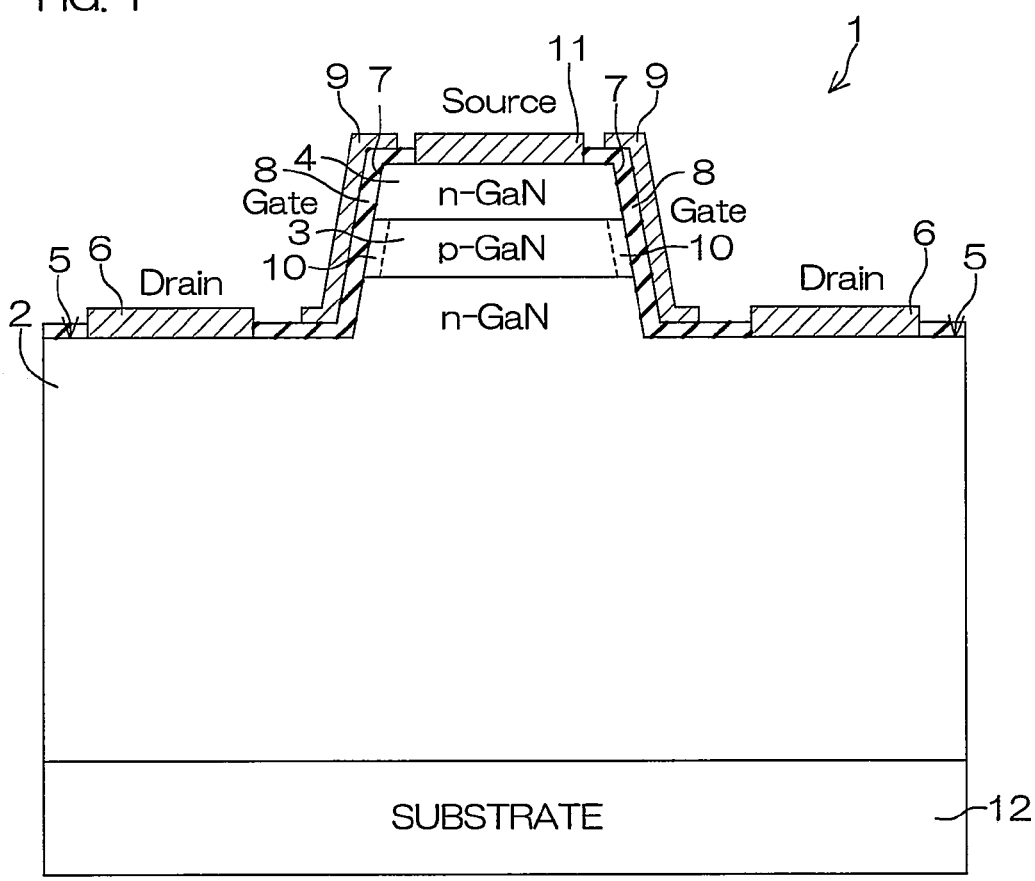
FIG. 1 A schematic sectional view for illustrating the structure of a field-effect transistor manufactured by a manufacturing method according to an embodiment of the present invention.

FIG. 1 is a schematic sectional view for illustrating the structure of a field-effect transistor manufactured by a manufacturing method according to an embodiment of the present invention.

The field-effect transistor (a nitride semiconductor device) includes a substrate 12 and a nitride semiconductor laminated structure portion 1 consisting of GaN compound semiconductor layers grown on the substrate 12.

As the substrate 12, an insulating substrate such as a sapphire substrate or a conductive substrate such as a GaN substrate, a ZnO substrate, an Si substrate, a GaAs substrate or an SiC substrate, for example, can be applied.

The nitride semiconductor laminated structure portion 1 includes an n-type GaN layer 2 (a first layer), a p-type GaN layer 3 (a second layer) and an n-type GaN layer 4 (a third layer), and the respective GaN layers are laminated in this order. Thus, the p-type GaN layer 3 is held between the n-type GaN layer 2 and the n-type GaN layer 4. The n-type GaN layer 2 and the n-type GaN layer 4 contain silicon (Si), for example, as an n-type impurity, and the p-type GaN layer 2 contains magnesium (Mg) as a p-type impurity.

The nitride semiconductor laminated structure portion 1 is etched in a direction across laminating interfaces up to such a depth that the n-type GaN layer 2 is exposed from the n-type GaN layer 4, to be trapezoidal (mesa-shaped) in section in FIG. 1. Thus, wall surfaces 7 extending over the n-type GaN layer 2, the p-type GaN layer 3 and the n-type GaN layer 4 are formed.

Drawn portions 5 drawn from both sides of the nitride semiconductor laminated structure portion 1 in a transverse direction (the direction is hereinafter referred to as a "width direction") along the laminating interfaces of the nitride semiconductor laminated structure portion 1 are formed on the n-type GaN layer 2, due to the formation of the wall surfaces 7. Drain electrodes 6 are formed on the surfaces of the drawn portions 5, to be in ohmic contact therewith. Thus, it follows that the drain electrodes 6 are electrically connected with the n-type GaN layer 2. The drain electrodes 6 may not be directly connected with the n-type GaN layer 2 so far as the same are electrically connected with the n-type GaN layer 2, but another GaN layer may be interposed so that the drain electrodes 6 are indirectly connected with the n-type GaN layer 2 through the GaN layer, for example.

Regions 10 of the p-type GaN layer 3 around the wall surfaces 7 are composed of a semiconductor different in conductivity from the p-type GaN layer 3, such as a p$^-$-type semiconductor having an acceptor concentration lower than the accepter concentration (the Mg concentration) of the p-type GaN layer 3, for example. The thicknesses of the regions 10 in a direction orthogonal to the wall surfaces 7 are several nm to 100 nm, for example. The material for the regions 10 is not restricted to the p$^-$-type semiconductor so far as the same is a semiconductor different in conductivity from the p-type GaN layer 3, and may be an n-type semiconductor containing an n-type impurity, an i-type semiconductor hardly containing an impurity, or a semiconductor containing n-type and p-type impurities, for example. A proper bias voltage is supplied to gate electrodes 9, so that inversion layers (channels) electrically conducting the n-type GaN layers 2 and 4 are formed in the vicinity of the surfaces of the regions 10.

A source electrode 11 is formed on the upper surface of the n-type GaN layer 4, to be in ohmic contact therewith. Thus, it follows that the source electrode 11 is electrically connected with the n-type GaN layer 4. The source electrode 11 may not be directly connected with the n-type GaN layer 4 so far as the same is electrically connected with the n-type GaN layer 4, but another GaN layer may be interposed so that the source electrode 11 is indirectly connected with the n-type GaN layer 4 through the GaN layer.

Gate insulating films 8 are formed on the upper surface (excluding the regions provided with the drain electrodes 6) of the n-type GaN layer 2, the upper surface (excluding the region provided with the source electrode 11) of the n-type GaN layer 4 and the wall surfaces 7, to be in contact with the surfaces. Further, gate electrodes 9 are formed on the gate insulating films 8, to be opposed to the regions 10 through the gate insulating films 8.

The nitride semiconductor laminated structure portion 1 is formed on the substrate 12 by the so-called metal organic chemical vapor deposition (MOCVD), for example.

When a substrate 12 having a major surface defined by a c-plane (0001) is employed, for example, it follows that the nitride semiconductor laminated structure portion 1 grown on the substrate 12 by epitaxy, i.e., the n-type GaN layer 2, the p-type GaN layer 3 and the n-type GaN layer 4 are also laminated with major surfaces defined by c-planes (0001). The surface orientations of the wall surfaces 7 of the nitride semiconductor laminated structure portion 1 having the trapezoidal (mesa-shaped) section are planes (planes other than c-planes) inclined in the range of 15° to 90° with respect to the c-planes (0001), for example. More specifically, the wall surfaces 7 are defined by nonpolar planes such as m-planes (10-10) or a-planes (11-20) or semipolar planes such as (10-13), (10-11) or (11-22), for example. FIG. 1 shows a case where the major surface of the substrate 12 is defined by the c-plane (0001) and the wall surfaces 7 are defined by semipolar planes.

The gate insulating films 8 can be constituted of an oxide or a nitride, for example. More specifically, the gate insulating films 8 can be constituted of silicon oxide ($SiO_2$), gallium oxide ($Ga_2O_3$), magnesium oxide (MgO), scandium oxide ($Sc_2O_3$), silicon nitride (SiN) or silicon oxynitride (SiON), and not less than two of these materials may be employed in combination.

The gate electrodes 9 can be constituted of a conductive material such as platinum (Pt), aluminum (Al), a nickel-gold alloy (an Ni—Au alloy), a nickel-titanium-gold alloy (an Ni—Ti—Au alloy), a palladium-gold alloy (a Pd—Au alloy), a palladium-titanium-gold alloy (a Pd—Ti—Au alloy), a palladium-platinum-gold alloy (a Pd—Pt—Au alloy) or polysilicon, for example.

The drain electrodes 6 are preferably constituted of a metal which can be brought into ohmic contact with the n-type GaN layer 2, such as a metal containing at least aluminum (Al), for example, and can more specifically be constituted of a titanium-aluminum alloy (a Ti—Al alloy). The source electrode 11 is also preferably constituted of a metal containing Al similarly to the drain electrodes 6, and can more specifically be constituted of a Ti—Al alloy. The drain electrodes 6 and the source electrode 11 are so constituted of metals containing Al that excellent contact with a wiring layer (not shown) can be attained. Alternatively, the drain electrodes 6 and the source electrode 11 may be constituted of molybdenum (Mo) or an Mo compound (molybdenum silicide, for example), titanium (Ti) or a Ti compound (titanium silicide, for example), or tungsten (W) or a W compound (tungsten silicide, for example).

An operation of the field-effect transistor is now described.

A bias voltage positive on the side of the drain electrodes 6 is supplied between the source electrode 11 and the drain electrodes 6. Thus, a reverse voltage is supplied to the p-n junction on the interface between the n-type GaN layer 2 and the p-type GaN layer 3, and the n-type GaN layer 4 and the n-type GaN layer 2, i.e., a source and a drain are cut off as a result. When a bias voltage of not less than a prescribed voltage value (a gate threshold voltage) positive with respect to the regions 10 is applied to the gate electrodes 9 from this state, electrons are induced in the vicinity of the surfaces of the regions 10, and inversion layers are formed. The n-type GaN layer 2 and the n-type GaN layer 4 conduct through the inversion layers. Thus, it follows that the source and the drain conduct. The regions 10 are composed of the $p^-$-type semiconductor having the acceptor concentration lower than that of the p-type GaN layer 3, whereby the electrons can be induced in the regions 10 with a lower gate threshold voltage at this time. When the p-type impurity concentration of the regions 10 is properly set, the source and the drain are conduct when a proper bias is supplied to the gate electrodes 9, while the source and the drain are cut off when no bias is supplied to the gate electrodes 9. In other words, a normally-off operation is implemented.

FIGS. 2A to 2E are schematic sectional views showing a method for manufacturing the field-effect transistor shown in FIG. 1 in step order.

In order to manufacture the field-effect transistor, the n-type GaN layer 2 and the p-type GaN layer 3 are first grown on the substrate 12 by a method such as metal organic chemical vapor deposition (MOCVD), liquid phase epitaxy (LPE), vapor phase epitaxy (VPE) or molecular beam epitaxy (MBE), for example. After the p-type GaN layer 3 is formed, the n-type GaN layer 4 is subsequently grown on the p-type GaN layer 3 without performing activation annealing treatment on the p-type GaN layer 3. Thus, the nitride semiconductor laminated structure portion 1 consisting of the n-type GaN layer 2, the p-type GaN layer 3 and the n-type GaN layer 4 formed on the substrate 12 is obtained, as shown in FIG. 2A.

Figure 2A:
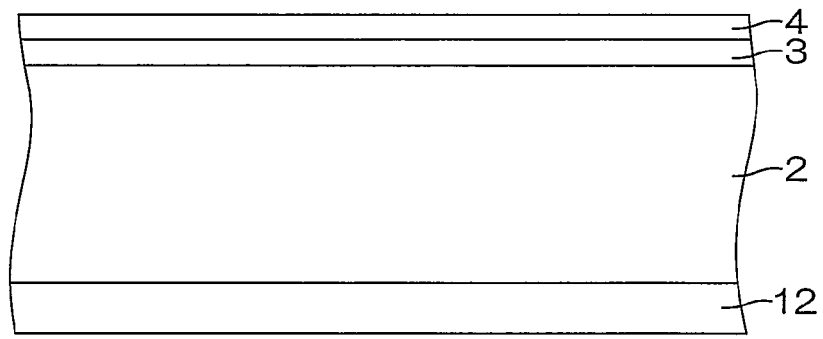
FIG. 2A A schematic sectional view showing the method for manufacturing the field-effect transistor shown in FIG. 1 in step order.

The step shown in FIG. 2A is more specifically described later with reference to FIG. 3. Among the epitaxy methods illustrated in the above, MOCVD is preferably applied. The "activation annealing treatment" denotes treatment of activating Mg (making Mg function as an acceptor) by annealing the p-type GaN layer 3 in an atmosphere (in an inert gas atmosphere, for example) where $H_2$ is generally nonpresent at a temperature of not less than 400° C., for example, after the p-type GaN layer 3 is formed thereby removing $H_2$ mixed into the p-type GaN layer 3.

Figure 2B:
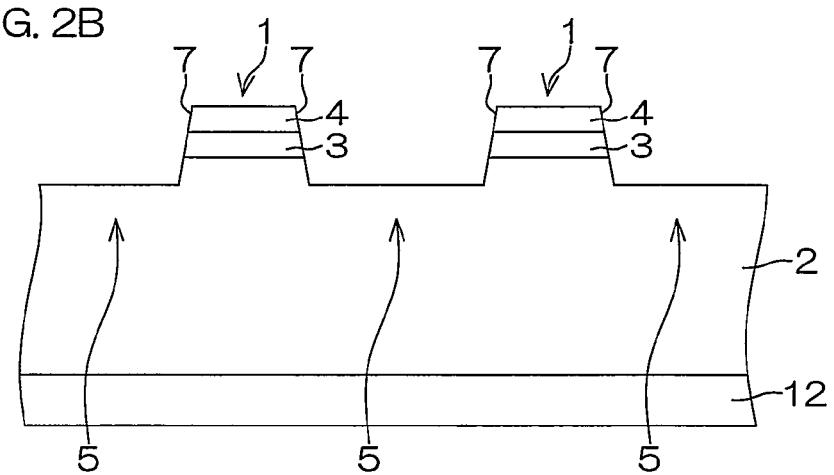
FIG. 2B A diagram showing a step subsequent to FIG. 2A.

After the nitride semiconductor laminated structure portion 1 is formed, the nitride semiconductor laminated structure portion 1 is etched in a striped manner so that the wall surfaces 7 having the surface orientations inclined in the range of 15° to 90° with respect to the c-planes (0001) are cut out, as shown in FIG. 2B (a wall surface forming step). Thus, the wall surfaces 7 passing through the p-type GaN layer 3 and reaching a layer-thickness intermediate portion of the n-type GaN layer 2 from the n-type GaN layer 4 are formed, and a plurality of (FIG. 2B shows only two) nitride semiconductor laminated structure portions 1 are shaped in a striped manner, while the drawn portions 5 consisting of extensions of the n-type GaN layer 2 are formed at the same time.

The wall surfaces 7 can be formed by dry etching (an isotropic etching) employing chlorine-based gas, for example. Further, wet etching treatment for improving the wall surfaces damaged by the dry etching may be thereafter performed, if necessary. Potassium hydroxide (KOH) or ammonia water is preferably employed for the wet etching treatment. The wet etching treatment is so performed that damaged surface layers of the wall surfaces 7 are removed and less-damaged wall surfaces can be obtained. The damages of the wall surfaces 7 are so reduced that crystalline states of the regions 10 can be excellently kept and the interfaces between the wall surfaces and the gate insulating films 8 can be rendered excellent, whereby interfacial levels can be reduced. Thus, channel resistance can be reduced, and a leakage current can be suppressed. Low-damage dry etching treatment can also be applied, in place of the wet etching treatment.

Figure 2C:
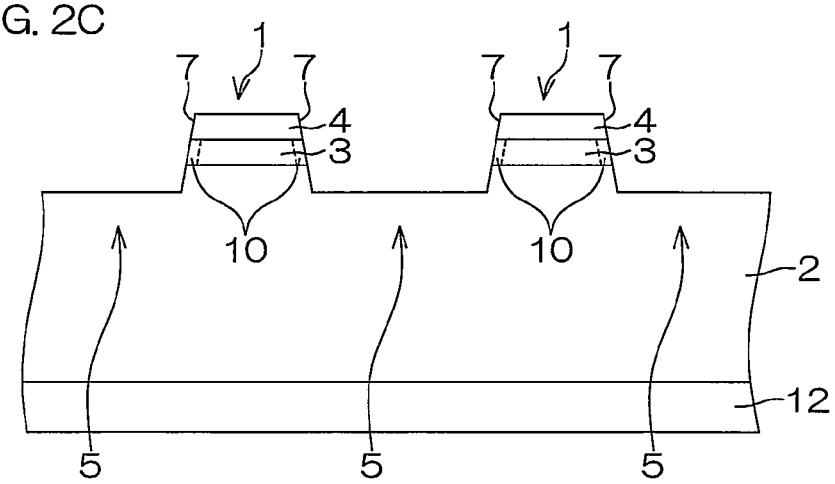
FIG. 2C A diagram showing a step subsequent to FIG. 2B.

Then, the gate insulating films 8 are formed on each nitride semiconductor laminated structure portion 1 by ECR (electron cyclotron resonance) sputtering, for example. In order to form the gate insulating films 8 by ECR sputtering, the substrate 12 provided with the nitride semiconductor laminated structure portion 1 is introduced into an ECR film forming apparatus, and $Ar^+$ plasma having energy of about 30 eV, for example, is applied thereto for several seconds. Due to the application of the $Ar^+$ plasma, the regions of the p-type GaN layer 3 around the wall surfaces 7 are altered and the regions 10 of the $p^-$-type semiconductor having the acceptor concentration lower than that of the p-type GaN layer 3, for example, different in conductivity from the p-type GaN layer 3 are formed, as shown in FIG. 2C (a fourth layer forming step).

Figure 2D:
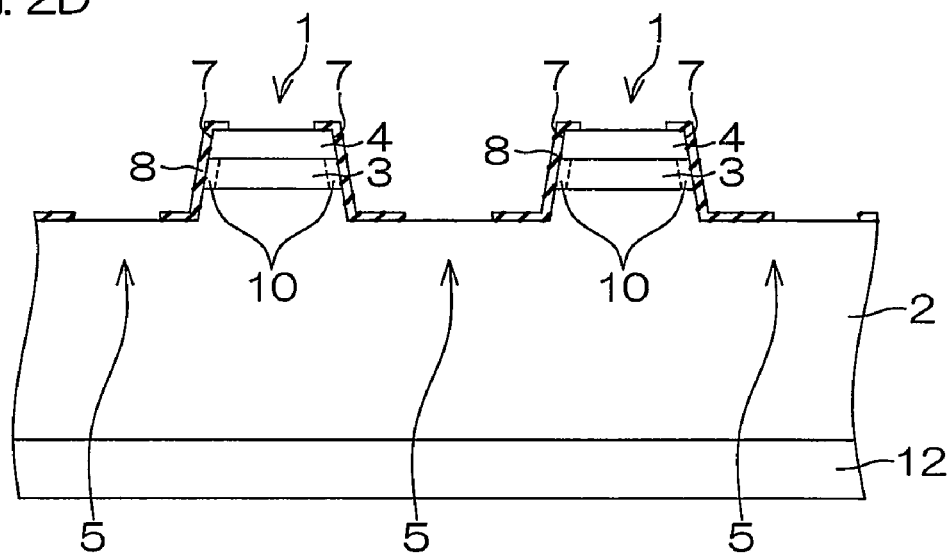
FIG. 2D A diagram showing a step subsequent to FIG. 2C.

Thereafter an insulating film (silicon oxide, gallium oxide or the like) covering the overall surface of the nitride semiconductor laminated structure portion 1 is formed. After the insulating film is formed, unnecessary portions (portions other than the gate insulating films 8) of the insulating film are removed by etching, as shown in FIG. 2D. Thus, the gate insulating films 8 are formed on the nitride semiconductor laminated structure portion 1 (a gate insulating film forming step).

The method for forming the gate insulating films 8 is not restricted to the ECR sputtering, but magnetron sputtering or the like can also be applied, for example. Depending on the method for forming the gate insulating films 8 and conditions for forming the same, oxygen which is an n-type impurity, for example, is ion-implanted into the wall surfaces 7 of the p-type GaN layer 3 in the formation of the gate insulating films 8, and hence the regions of the p-type GaN layer 3 around the wall surfaces 7 are altered also in the formation of the gate insulating films 8. In other words, the step of forming the regions 10 and the step of forming the gate insulating films 8 are parallelly carried out at the same time. While FIGS. 2C to 2E and FIG. 1 show the regions 10 only on the wall surfaces 7 of the p-type GaN layer 3, altered regions are formed also on the wall surfaces 7 of the n-type GaN layer 2 and the n-type GaN layer 4 in practice. However, the effects of the device remain unchanged even when the altered regions are formed also on the wall surfaces 7 of the n-type GaN layer 2 and the n-type GaN layer 4, and hence FIGS. 1 and 2A to 2E omit the altered regions.

Then, a photoresist film (not shown) having openings in regions for forming the drain electrodes 6 and the source electrode 11 is formed on the gate insulating films 8 by well-known photolithography, and a metal (platinum, aluminum or the like, for example) employed as the material for the electrodes (6 and 11) is formed by sputtering or the like. Thereafter the photoresist film is removed, so that unnecessary portions (portions other than the electrodes (6 and 11)) of the metal are lifted off along with the photoresist film. Thus, the drain electrodes 6 are formed to be in contact with the upper surfaces of the drawn portions 5 (the extensions of the n-type GaN layer 2), and the source electrode 11 is formed to be in contact with the upper surface of the n-type GaN layer 4 (see FIG. 2E).

Figure 2E:
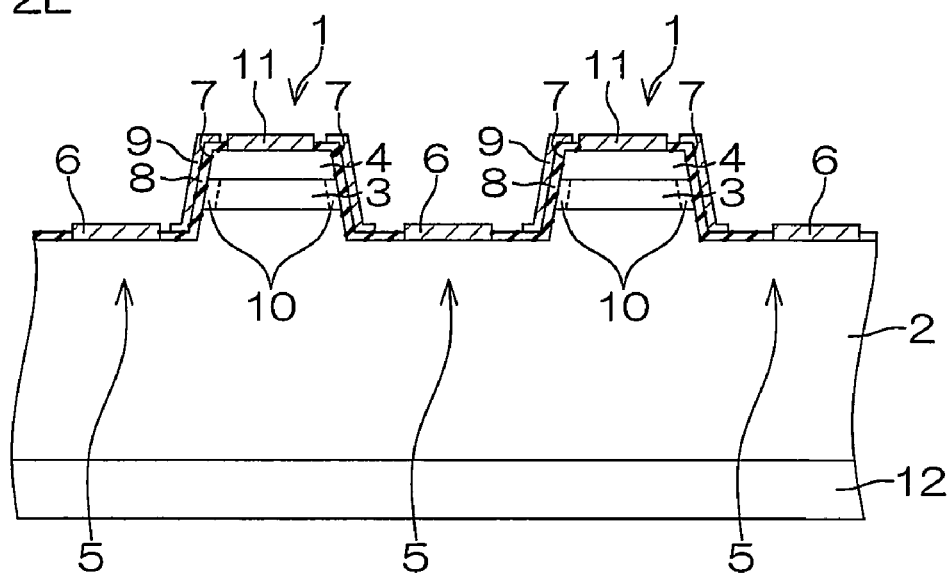
FIG. 2E A diagram showing a step subsequent to FIG. 2D.

After the drain electrodes 6 and the source electrode 11 are formed, thermal alloying (annealing treatment) is performed, and the gate electrodes 9 opposed to the regions 10 through the gate insulating films 8 are formed by a method similar to that in the cases of the drain electrodes 6 and the source electrode 11 (see FIG. 2E).

Thus, the field-effect transistor having the structure shown in FIG. 1 can be obtained.

While the regions 10 have been formed in the step of forming the gate insulating films 8 in the aforementioned manufacturing steps, a step of applying plasma or electron beams to the regions of the wall surfaces 7 of the p-type GaN layer 3 and a step of performing ion implantation on the regions of the wall surfaces 7 of the p-type GaN layer 3 may be further provided independently of the step of forming the gate insulating films 8, for example. According to these steps, the regions 10 composed of an n-type semiconductor can be formed by altering the regions of the p-type GaN layer 3 around the wall surfaces 7.

While the semiconductor layers holding the p-type GaN layer 3 therebetween have been the n-type GaN layer 2 and the n-type GaN layer 4 of the n type in the nitride semiconductor laminated structure portion 1, these are not restricted to the n type but may be layers composed of i-type group III nitride semiconductors hardly containing impurities, and the withstand voltage of the transistor can be controlled by properly changing n-type impurity concentrations.

Further, while the nitride semiconductor laminated structure portion 1 has been formed as a laminated structure consisting of an npn structure, the same may have such a laminated structure that a further semiconductor layer is laminated on the n-type GaN layer 4, for example, so far as the same has a MOS structure on the laminated structure in which the p-type GaN layer 3 is held between the n-type GaN layer 2 and the n-type GaN layer 4. In addition, each of the n-type GaN layer 2, the p-type GaN layer 3 and the n-type GaN layer 4 may have a structure consisting of a plurality of layers having different compositions and different impurity concentrations.

The plurality of nitride semiconductor laminated structure portions 1 formed on the substrate 12 in a striped manner form unit cells respectively. The gate electrodes 9, the drain electrodes 6 and the source electrodes 11 of the plurality of nitride semiconductor laminated structure portions 1 are common-connected with one another on unshown positions respectively. The drain electrodes 6 can be shared by adjacent ones of the nitride semiconductor laminated structure portions 1.

Figure 3:
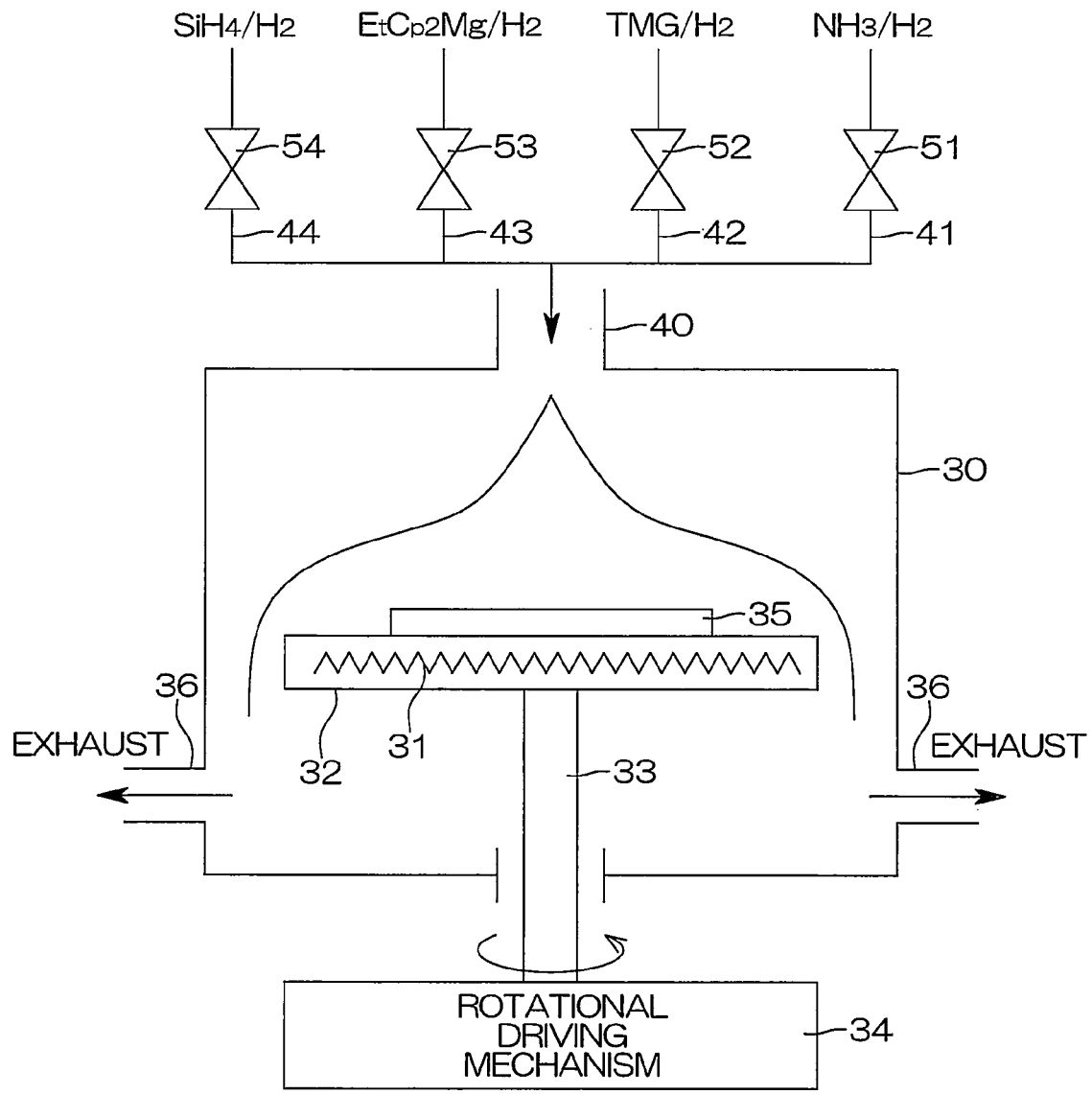
FIG. 3 A schematic diagram for illustrating the structure of a treating apparatus for forming a nitride semiconductor laminated structure portion.

FIG. 3 is a schematic diagram for illustrating the structure of a treating apparatus for forming the nitride semiconductor laminated structure portion 1.

The treating apparatus is a vertical MOCVD apparatus, and includes a treating chamber 30. A susceptor 32 storing a heater 31 is arranged in the treating chamber 30. The susceptor 32 is coupled to a rotating shaft 33, and the rotating shaft 33 is rotated by a rotational driving mechanism 34 arranged outside the treating chamber 30. Thus, a wafer 35 to be treated can be heated to a prescribed temperature and rotated in the treating chamber 30 by making the susceptor 32 hold the wafer 35. The wafer 35 is a GaN single-crystalline wafer, for example, constituting the aforementioned substrate 12.

Two exhaust pipes 36 are connected to the lower portion of the treating chamber 30. The exhaust pipes 36 are connected to exhaust equipment such as a rotary pump. Thus, the pressure in the treating chamber 30 is set to 1/10 atm. (about 10 kPa) to ordinary pressure (about 100 kPa), and the atmosphere in the treating chamber 30 is regularly exhausted.

On the other hand, a source gas feed passage 40 for feeding source gasses toward the surface of the wafer 35 held by the susceptor 32 is introduced into the upper surface of the treating chamber 30. A nitrogen material pipe 41 feeding ammonia as a nitrogen source gas, a gallium material pipe 42 feeding trimethyl gallium (TMG) as a gallium source gas, a magnesium material pipe 43 feeding ethylcyclopentadienyl magnesium (EtCp$_2$Mg) as a magnesium source gas and a silicon material pipe 44 feeding silane (SiH$_4$) as a source gas of silicon are connected to the source gas feed passage 40.

Valves 51 to 54 are interposed in the material pipes 41 to 44 respectively. Each source gas is fed along with a carrier gas consisting of hydrogen, nitrogen or both of these, or fed as a pure gas with no such carrier gas. Referring to FIG. 3, hydrogen (H$_2$) is employed as the carrier gas when the carrier gas is employed.

In order to grow the nitride semiconductor laminated structure portion 1 on the wafer 35 with the treating apparatus, the susceptor 32 is first made to hold a GaN single-crystalline wafer having a major surface defined by a c-plane (0001), for example, as the wafer 35. In this state, the nitrogen material valve 51 is opened while the valves 52 to 54 are kept closed, so that an ammonia gas (the nitrogen source gas) is fed into the treating chamber 30. Further, the heater 31 is electrified, and the water temperature is increased to 1000° to 1100° C. (1060° C., for example). Thus, the GaN semiconductor can be grown without roughening the surface.

After waiting until the wafer temperature reaches 1000° C. to 110° C., the gallium material valve 52 and the silicon material valve 54 are opened. Thus, trimethyl gallium along with the carrier gas (H$_2$) and a pure gas of silane are fed from the source gas feed passage 40 for 1800 s. to 10800 s., for example. Consequently, the n-type GaN layer 2 (layer thickness: 1 μm to 4 μm, Si concentration: $10^{16}$ cm$^{-3}$ to $10^{19}$ cm$^{-3}$) consisting of a GaN layer doped with silicon is formed on the surface of the wafer 35.

In the formation of the n-type GaN layer 2, each source gas is preferably fed at a gas flow rate shown below, for example.

(Gas Flow Rate of Each Source Gas)

Ammonia: an ammonia gas (a pure gas) is fed at a flow rate of 10000 sccm to 20000 sccm.

Trimethyl gallium: Trimethyl gallium (liquid) is bubbled with H$_2$ at a flow rate of 10 sccm to 40 sccm (the temperature of a thermostat is about 5° C., for example), and a gas generated by the bubbling is diluted with H$_2$ (the carrier gas) and fed.

Silane: A silane gas (a pure gas) is fed at a flow rate of 0 to 50 sccm. The case where the silane flow rate is 0 sccm is a case of forming an i-type GaN layer in place of the n-type GaN layer 2. The silane gas may be properly diluted with H$_2$ and fed.

After the n-type GaN layer 2 is formed, growth of the p-type GaN layer 3 is performed. In order to grow the p-type GaN layer 3, the nitrogen material valve 51, the gallium material valve 52 and the magnesium material valve 53 are opened, while the silicon material valve 54 is closed. Thus, a pure gas of ammonia as well as trimethyl gallium and ethylcyclopentadienyl magnesium along with the carrier gas (H$_2$) are fed from the source gas feed passage 40 for 500 s. to 3600 s., and it follows that the p-type GaN layer 3 (layer thickness: 0.1 μm to 1.5 μm, Mg concentration: $10^{17}$ cm$^{-3}$ to $10^{20}$ cm$^{-3}$) consisting of a GaN layer doped with magnesium is formed.

In the formation of the p-type GaN layer 3, the temperature of the wafer 35 is preferably set to 1000° C. to 1100° C. (1060° C., for example). In the formation of the p-type GaN layer 3, further, each source gas is preferably fed at a gas flow rate shown below.

(Gas Flow Rate of Each Source Gas)

Ammonia: An ammonia gas (a pure gas) is fed at a flow rate of 10000 sccm to 20000 sccm.

Trimethyl gallium: Trimethyl gallium (liquid) is bubbled with $H_2$ at a flow rate of 10 sccm to 40 sccm (the temperature of a thermostat is about 5° C., for example), and a gas generated by the bubbling is diluted with $H_2$ and fed.

Ethylcyclopentadienyl magnesium: Ethylcyclopentadienyl magnesium (liquid) is bubbled with $H_2$ at a flow rate of 10 sccm to 200 sccm (the temperature of a thermostat is about 30° C., for example), and a gas generated by the bubbling is diluted with $H_2$ and fed.

After the p-type GaN layer 3 is formed, no activation annealing treatment is performed on the p-type GaN layer 3, but the n-type GaN layer 4 is grown on the p-type GaN layer 3 as such.

In order to grow the n-type GaN layer 4, the nitrogen material valve 51, the gallium material valve 52 and the silicon material valve 54 are opened while the magnesium material valve 53 is closed, similarly to the n-type GaN layer 2. Thus, pure gases of ammonia and silane as well as trimethyl gallium along with the carrier gas ($H_2$) are fed from the source gas feed passage 40 toward the wafer 35 for 500 s. to 3600 s., and it follows that the n-type GaN layer 4 (layer thickness: 0.1 μm to 1.5 μm, Si concentration: $10^{16}$ cm$^{-3}$ to $10^{19}$ cm$^{-3}$) consisting of a GaN layer doped with silicon is formed. In the formation of the n-type GaN layer 4, the temperature of the wafer 35 is preferably set to 1000° C. to 1100° C. (1060° C., for example). In the formation of the n-type GaN layer 4, further, each source gas is preferably fed at a gas flow rate shown below.

(Gas Flow Rate of Each Source Gas)

Ammonia: An ammonia gas (a pure gas) is fed at a flow rate of 10000 sccm to 20000 sccm.

Trimethyl gallium: Trimethyl gallium (liquid) is bubbled with $H_2$ at a flow rate of 10 sccm to 40 sccm (the temperature of a thermostat is about 5° C., for example), and a gas generated by the bubbling is diluted with $H_2$ and fed.

Silane: A silane gas (a pure gas) is fed at a flow rate of 0 to 50 sccm. The case where the silane flow rate is 0 sccm is a case of forming an i-type GaN layer in place of the n-type GaN layer 4. The silane gas may be properly diluted with $H_2$ and fed.

After the nitride semiconductor laminated structure portion 1 is formed on the wafer 35 (the substrate 12) in this manner, the wafer 35 is transferred to an etching apparatus. Then, the wall surfaces 7 are formed on the nitride semiconductor laminated structure portion 1 by dry etching (plasma etching, for example) to extend over the n-type GaN layer 2, the p-type GaN layer 3 and the n-type GaN layer 4, as shown in FIG. 2B. Thereafter the steps shown in FIGS. 2C to 2E are carried out, and the aforementioned field-effect transistor is obtained.

According to the embodiment, as hereinabove described, the p-type GaN layer 3 containing Mg is formed on the n-type GaN layer 2, and the n-type GaN layer 4 is thereafter formed on the p-type GaN layer 3 while no activation annealing treatment is performed on the p-type GaN layer 3. Thus, the nitride semiconductor laminated structure portion 1 is so formed as to hold the p-type GaN layer 3 between the n-type GaN layer 2 and the n-type GaN layer 4, whereby Mg in the p-type GaN layer 3 of the nitride semiconductor laminated structure portion 1 can be kept in an active state and made to function as an acceptor. Consequently, resistance of the p-type GaN layer 3 can be reduced. As a result, the nitride semiconductor laminated structure portion 1 can be suitably employed as a semiconductor structure of a power device requiring a high current.

Further, a vertical transistor structure obtained by laminating the n-type GaN layer 2, the p-type GaN layer 3 and the n-type GaN layer 4 is so employed that a high current can be fed and a field-effect transistor having a high withstand voltage can be implemented.

In addition, the structure of forming the gate insulating films 8 to be in contact with the regions 10 formed on the surfaces of the p-type GaN layer 3 exposed on the wall surfaces 7 is so employed that the value of a gate voltage necessary for forming the inversion layers can be reduced. Consequently, an excellent transistor operation can be performed by reducing the gate threshold voltage while keeping the acceptor concentration in the p-type GaN layer 3 high to cause no reach-through breakdown, and it is also possible to implement an excellent power device. Further, the normally-off operation is enabled by controlling the impurity concentration in and the thickness of the regions 10.

While one embodiment of the present invention has been described, the present invention may be embodied in other ways.

For example, while the drain electrodes 6 have been formed in contact with the surfaces of the drawn portions 5 in the aforementioned embodiment, a conductive substrate may be applied as the substrate 12, for example, so that a drain electrode is formed in contact to cover the overall region of a surface of the conductive substrate opposite to a surface provided with the nitride semiconductor laminated structure portion 1. Further, the substrate 12 may be removed in the manufacturing steps for the field-effect transistor by a method such as laser lift-off, CMP (chemical mechanical polishing) treatment or etching treatment, for example, so that a drain electrode is formed in contact to cover the overall region of the surface of the n-type GaN layer 2 exposed by the removal.

While the source electrode 11 and the drain electrodes 6 have been formed to be in contact with the n-type GaN layer 4 and the n-type GaN layer 2 respectively in the aforementioned embodiment, the positions of the arrangement of the source electrode 11 and the drain electrodes 6 may be exchanged.

While ammonia and silane have been fed as pure gases respectively when growing the nitride semiconductor laminated structure portion 1 on the wafer 35 in the aforementioned embodiment, these may not be fed as pure gasses, but may be diluted with the carrier gas ($H_2$) and fed.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-61923 filed with the Japan Patent Office on Mar. 12, 2007, the disclosure of which is incorporated herein by reference.

EXAMPLES

While the present invention is now described with reference to Examples, the present invention is not restricted by the following Examples.

Example 1

The susceptor of the treating apparatus having the structure shown in FIG. 3 was made to hold a wafer (a sapphire substrate), and an n-type GaN layer (a first layer) containing Si, a p-type GaN layer (a second layer) containing Mg, an n-type GaN layer (a third layer) containing Si and a p-type GaN layer (a fourth layer) containing Mg were successively grown on the wafer by MOCVD under conditions shown in Table 1 (growth rate: 1.3 μm/h to 1.5 μm/h, thermostat temperature for TMG: about 5° C., thermostat temperature for $EtCp_2Mg$: about 30° C.). TMG and $EtCp_2Mg$ were bubbled with $H_2$, and gases generated by the bubbling were fed with the carrier gas ($H_2$). On the other hand, ammonia and silane were fed as pure gases, without employing the carrier gas ($H_2$). Thus, a GaN nitride semiconductor laminated structure consisting of an npnp laminated structure was obtained. The following measurement was performed on the obtained nitride semiconductor laminated structure:

[Table 1]

Referring to Table 1, bubbling gas flow rates of TMG and $EtCp_2Mg$ show gas flow rates of $H_2$ at the time of bubbling TMG (liquid) and $EtCp_2Mg$ (liquid) with $H_2$.

Measurement of $H_2$ Concentration and Mg Concentration

Figure 4:
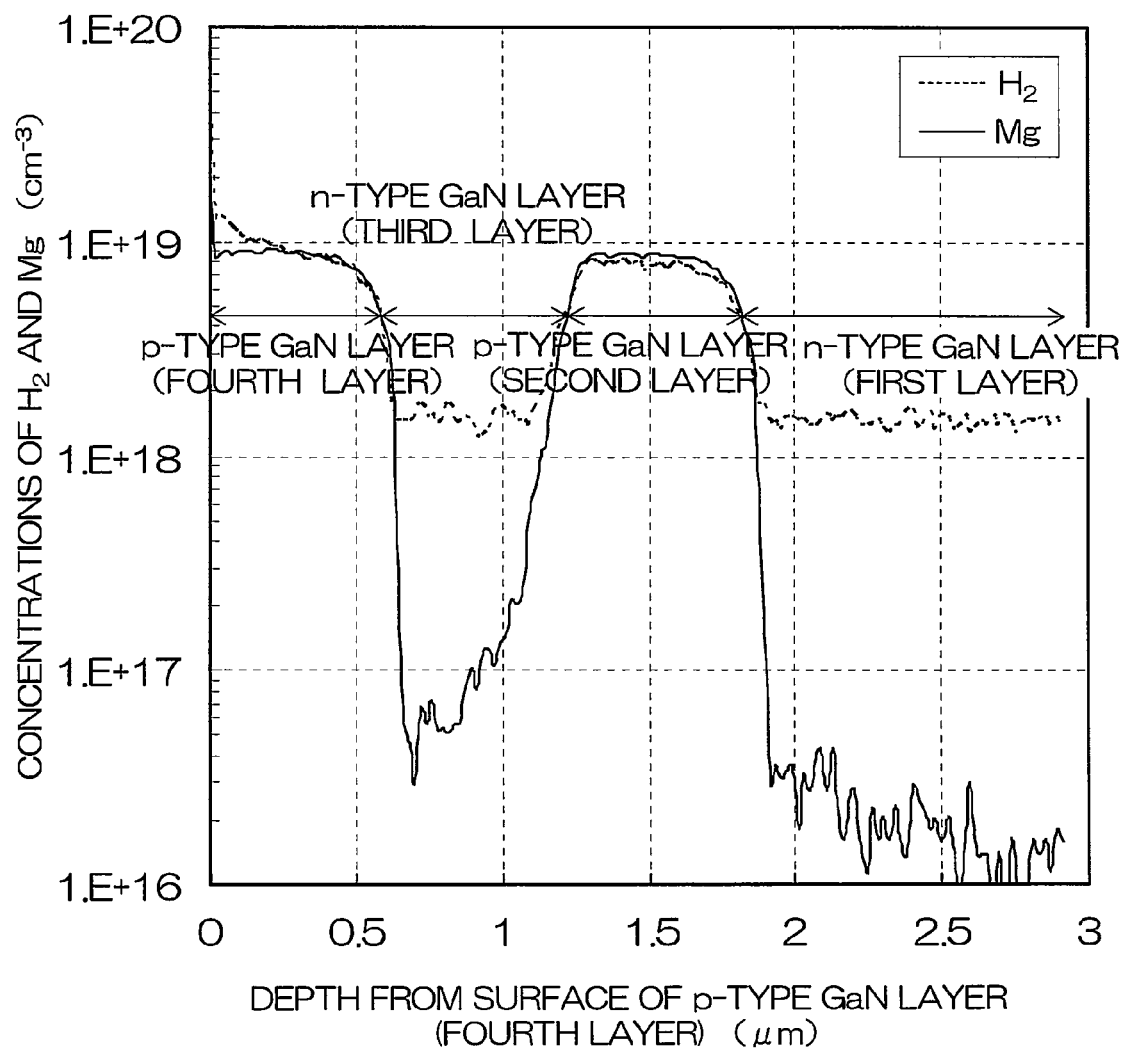
FIG. 4 A graph showing changes in the concentrations of $H_2$ and Mg contained in respective GaN layers in a nitride semiconductor laminated structure according to Example 1.

The concentrations of $H_2$ and Mg contained in the respective GaN layers of the obtained nitride semiconductor laminated structure were measured by secondary ion mass spectrometry (SIMS). FIG. 4 shows the results. FIG. 4 is a graph showing changes of the concentrations of $H_2$ and Mg contained in the respective GaN layers of the nitride semiconductor laminated structure according to Example 1, for showing the difference between the structures of the p-type GaN layer (the second layer) held between the n-type GaN layers and the p-type GaN layer (the fourth layer) of the outermost surface.

As shown in FIG. 4, the concentration of Mg is $8.86 \times 10^{18}$ $cm^{-3}$ and the concentration of $H_2$ is $7.77 \times 10^{18}$ $cm^{-3}$ on a position where the depth from the surface of the p-type GaN layer (the fourth layer) is 1.5 μm, i.e., in the p-type GaN layer (the second layer). In other words, the concentration of Mg is greater than the concentration of $H_2$ by $1.09 \times 10^{18}$ $cm^{-3}$. Thus, the presence of Mg (Mg not bonded to H) in an active state functioning as an acceptor has been confirmed in the p-type GaN layer (the second layer).

On the other hand, the Mg concentration is identical to the $H_2$ concentration on a position where the depth from the surface of the p-type GaN layer (the fourth layer) is 0.25 μm, i.e., in the p-type GaN layer (the fourth layer). Thus, it has been confirmed that the p-type GaN layer (the fourth layer) was not activated.

As described above, a laminated structure consisting of an n-type GaN layer (a first layer), a p-type GaN layer (a second layer) and an n-type GaN layer (a third layer) is brought into a MOS structure in a field-effect transistor, whereby the field-effect transistor can be suitably employed as a semiconductor structure of a power device.

Example 2

A field-effect transistor having an npn laminated structure consisting of an n-type GaN layer (a first layer) containing Si, a p-type GaN layer (a second layer) containing Mg and an n-type GaN layer (a third layer) containing Si was prepared on the basis of the manufacturing method illustrated in the aforementioned embodiment.

Measurement of Gate Voltage-Drain Current Characteristics

Figure 5:
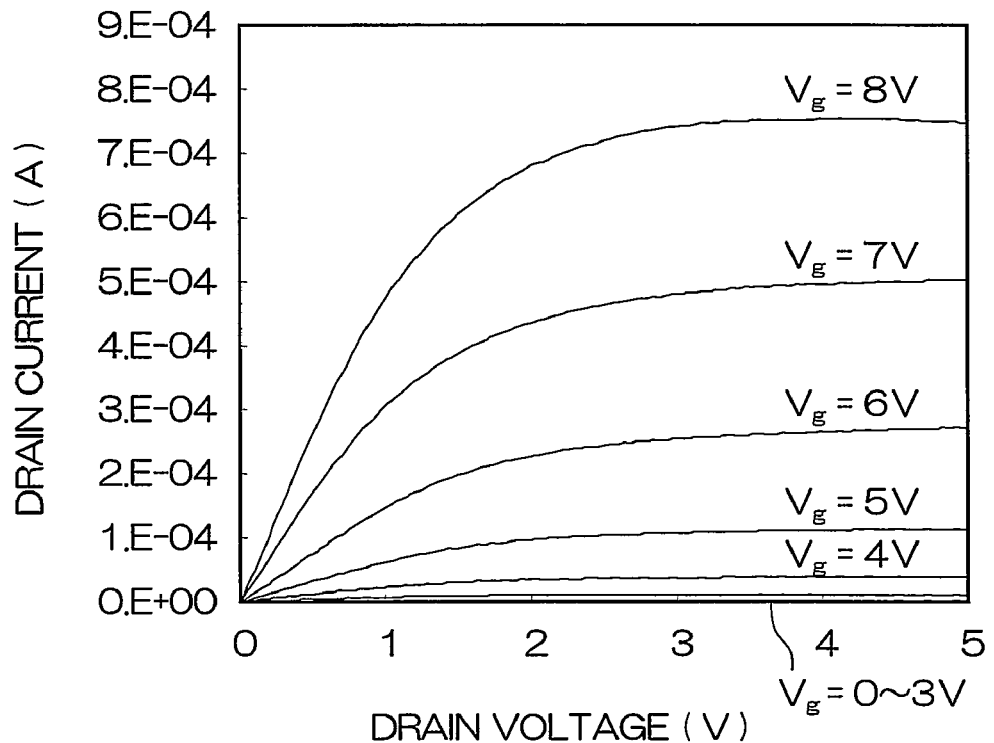
FIG. 5 A graph showing gate voltage-drain current characteristics of a field-effect transistor according to Example 2.
Figure 6:
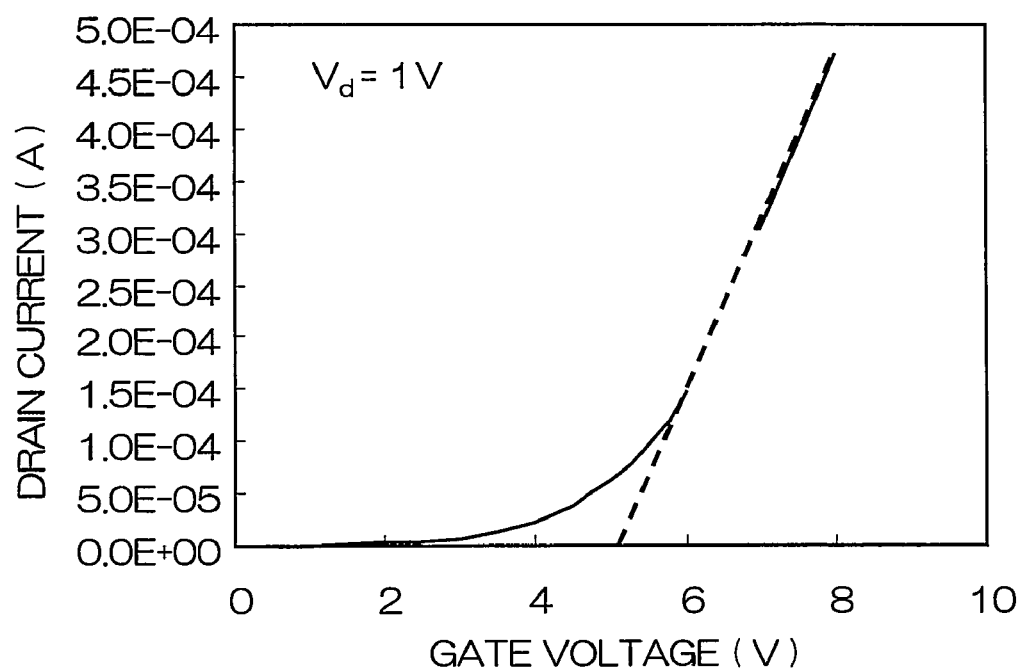
FIG. 6 A graph showing gate voltage-drain current characteristics of the field-effect transistor according to Example 2.

Gate voltage-drain current characteristics of the obtained field-effect transistor were measured. FIGS. 5 and 6 show the results. FIG. 5 shows changes of the drain current ($I_d$) in a case of fixing the gate voltage ($V_g$) to a constant value and sweeping the drain voltage ($V_d$). FIG. 6 shows changes of the drain current ($I_d$) in a case of fixing the drain voltage ($V_d$) to a constant value and sweeping the gate voltage ($V_g$).

When the gate voltage ($V_g$) is 0 V, i.e., when no bias is supplied to a gate electrode, no drain current flows even if a bias is supplied to a drain electrode, as shown in FIGS. 5 and 6. Thus, it has been confirmed that such a normally-off operation that the source and the drain are cut off when no bias is supplied to the gate electrode was implemented. Thus, it has been confirmed that the p-type GaN layer (the second layer) is activated and a normally-off transistor can be implemented also when no activation annealing treatment is performed on the p-type GaN layer (the second layer).

The invention claimed is:

1. A method for forming a nitride semiconductor laminated structure, comprising:
    forming a first layer that is an n-type or i-type first layer composed of a group III nitride semiconductor using an $H_2$ carrier gas;
    forming a second layer by laminating a p-type second layer composed of a group III nitride semiconductor and containing Mg on the first layer using an $H_2$ carrier gas; and
    forming a third layer that is an n-type or i-type third layer composed of a group III nitride semiconductor on the second layer using an $H_2$ carrier gas after forming the second layer.

2. A method for manufacturing a nitride semiconductor device, comprising:
    forming a first layer that is an n-type or i-type first layer composed of a group III nitride semiconductor using an $H_2$ carrier gas;
    forming a second layer by laminating a p-type second layer composed of a group III nitride semiconductor and containing Mg on the first layer using an $H_2$ carrier gas;
    forming, a third layer that is an n-type or i-type third layer composed of a group III nitride semiconductor on the second layer using an $H_2$ carrier gas after forming the second layer;
    forming a wall surface that extends over the first, second and third layers;
    forming a gate insulating film on the wall surface to extend over the first, second and third layers;
    forming a gate electrode, that is opposed to the wall surface, on the second layer through the gate insulating film;
    forming a drain electrode that is electrically connected to the first layer; and
    forming a source electrode that is electrically connected to the third layer.

3. The method for manufacturing a nitride semiconductor device according to claim 2, further comprising forming a fourth layer that has a different conductivity from that of the second layer on a semiconductor surface portion of the second layer exposed due to forming the wall surface.

* * * * *